(12) United States Patent
Kim

(10) Patent No.: US 11,793,039 B2
(45) Date of Patent: Oct. 17, 2023

(54) DISPLAY DEVICE

(71) Applicant: Samsung Display Co., Ltd., Yongin-Si (KR)

(72) Inventor: Keun Woo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 270 days.

(21) Appl. No.: 17/377,278

(22) Filed: Jul. 15, 2021

(65) Prior Publication Data

US 2022/0165830 A1 May 26, 2022

(30) Foreign Application Priority Data

Nov. 25, 2020 (KR) .......................... 10-2020-0159978

(51) Int. Cl.
| | | |
|---|---|---|
| *H01L 27/32* | (2006.01) | |
| *H10K 59/126* | (2023.01) | |
| *H10K 59/65* | (2023.01) | |
| *H10K 59/121* | (2023.01) | |
| *H10K 77/10* | (2023.01) | |
| *H01L 29/786* | (2006.01) | |

(Continued)

(52) U.S. Cl.
CPC ....... *H10K 59/126* (2023.02); *H10K 59/1213* (2023.02); *H10K 59/65* (2023.02); *H10K 77/111* (2023.02); *H01L 27/1222* (2013.01); *H01L 29/78633* (2013.01); *H01L 29/78675* (2013.01); *H10K 2102/311* (2023.02)

(58) Field of Classification Search
CPC .. H10K 59/126; H10K 59/1213; H10K 59/65; H10K 77/111; H10K 2102/311; H10K 59/40; H10K 59/12; H10K 59/131; H10K 59/35; H01L 27/1222; H01L 29/78633; H01L 29/78675; H01L 27/1218; H01L 27/124

See application file for complete search history.

(56) References Cited

U.S. PATENT DOCUMENTS

| | | | | |
|---|---|---|---|---|
| 2012/0168756 | A1* | 7/2012 | Ryu | .................. H01L 29/78633 257/66 |
| 2020/0203535 | A1* | 6/2020 | Choi | .................. H01L 25/0753 |
| 2021/0049958 | A1 | 2/2021 | Kim et al. | |

FOREIGN PATENT DOCUMENTS

| | | |
|---|---|---|
| KR | 10-0742494 B1 | 7/2007 |
| KR | 10-2016-0068635 A | 6/2016 |

(Continued)

*Primary Examiner* — Mohammed R Alam
(74) *Attorney, Agent, or Firm* — Innovation Counsel LLP

(57) ABSTRACT

An embodiment of a display device includes a display panel having a flexible characteristic and a rear passivation layer disposed on a rear surface of the display panel and including an opening, wherein a pixel is formed in an area of the display panel corresponding to the opening. The display panel includes: a flexible substrate including a polyimide layer and a barrier layer disposed on the polyimide layer; a driving transistor and a fifth transistor disposed on the substrate and including a polycrystalline semiconductor layer; a light emitting diode receiving an output current of the driving transistor; and a bottom metal layer disposed between the polyimide layer and the polycrystalline semiconductor layer in a cross-sectional view and disposed around a channel of the driving transistor in a plan view.

20 Claims, 16 Drawing Sheets

(51) Int. Cl.
 *H01L 27/12* (2006.01)
 *H10K 102/00* (2023.01)

(56) References Cited

FOREIGN PATENT DOCUMENTS

KR  10-2019-0115166 A  10/2019
KR  10-2020-0029081 A  3/2020

* cited by examiner

DISPLAY DEVICE

CROSS-REFERENCE TO RELATED APPLICATION

This application claims priority to and the benefit of Korean Patent Application No. 10-2020-0159978 filed in the Korean Intellectual Property Office on Nov. 25, 2020, the entire contents of which are incorporated herein by reference.

BACKGROUND

1. Field

The present disclosure relates to a display device, and more specifically, to a display device including a light emitting diode.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

Since the OLED display has a self-luminance characteristic and does not require a separate light source, unlike the LCD, thickness and weight thereof may be reduced. In addition, the OLED display has high-quality characteristics such as low power consumption, high luminance, and high response speed.

Recently, the OLED display has been formed on a plastic substrate to have a flexible structure.

The above information disclosed in this Background section is only for enhancement of understanding of the background of the described technology, and therefore it may contain information that does not form the prior art that is already known in this country to a person of ordinary skill in the art.

SUMMARY

An embodiment provides a display device including: a display panel having a flexible characteristic; and a rear passivation layer disposed on a rear surface of the display panel and including an opening, wherein a pixel formed in an area of the display panel corresponding to the opening includes: a flexible substrate including a polyimide layer, and a barrier layer disposed on the polyimide layer; a driving transistor and a fifth transistor disposed on the substrate and including a polycrystalline semiconductor layer; a light emitting diode receiving an output current of the driving transistor; and a bottom metal layer disposed between the polyimide layer and the polycrystalline semiconductor layer in a cross-sectional view and disposed around a channel of the driving transistor in a plan view.

A camera or an optical element may be disposed in the opening of the rear passivation layer.

The display panel may have a first display area that does not correspond to the opening and a second display area that corresponds to the opening, the second display area may include a transmissive area and a pixel area, and the pixel may be disposed in the pixel area.

The bottom metal layer may include a linear portion.

The bottom metal layer may further include a vertical portion positioned at at least one of respective ends of the linear portion.

The bottom metal layer may further include a protrusion, and the protrusion may protrude according to a shape of the polycrystalline semiconductor layer including the channel of the driving transistor.

The bottom metal layer may include a middle opening.

The driving transistor may further include a gate electrode, and the gate electrode of the driving transistor may partially overlap the bottom metal layer in a plan view.

The display device may further include a buffer layer disposed between the substrate and the polycrystalline semiconductor layer, wherein the bottom metal layer may be disposed on the substrate and is covered with the buffer layer.

The bottom metal layer may be disposed on the polyimide layer, and may be covered by the barrier layer.

The substrate may include two polyimide layers and two barrier area layers.

A fingerprint sensor may be disposed in the opening of the rear passivation layer.

Another embodiment provides a display device including: a flexible substrate including a polyimide layer, and a barrier layer disposed on the polyimide layer; and a unit pixel disposed on the substrate and including a first pixel, a second pixel, and a third pixel, wherein each of the first pixel, the second pixel, and the third pixel includes: a driving transistor disposed on the substrate and including a polycrystalline semiconductor layer; a light emitting diode receiving an output current of the driving transistor; and a bottom metal layer disposed between the polyimide layer and the polycrystalline semiconductor layer in a cross-sectional view and disposed around a channel of the driving transistor in a plan view, and a shape of a first bottom metal layer included in the first pixel is different from a shape of a second bottom metal layer included in the second pixel and a shape of a third bottom metal layer included in the third pixel.

At least one of the first bottom metal layer, the second bottom metal layer, and the third bottom metal layer may include a linear portion, and a vertical portion disposed at at least one of respective ends of the linear portion.

At least one of the first bottom metal layer, the second bottom metal layer, and the third bottom metal layer may include a protrusion, and the protrusion may protrude according to a shape of the polycrystalline semiconductor layer including the channel of the driving transistor.

The display device may further include a buffer layer disposed between the substrate and the polycrystalline semiconductor layer, wherein the bottom metal layer may be disposed on the substrate and is covered with the buffer layer.

The bottom metal layer may be disposed on the polyimide layer, and may be covered by the barrier layer.

The display device may further include a rear passivation layer disposed on a rear surface of the substrate and including an opening, wherein the unit pixel may be formed in an area of the substrate corresponding to the opening.

According to the embodiments, a bottom metal layer is disposed around a driving transistor of a pixel and is disposed between a substrate and a driving transistor in a cross-sectional view, so that characteristics of the driving transistor of the pixel are not changed due to light or polarity caused by a flexible substrate.

DETAILED DESCRIPTION

Figure 1:
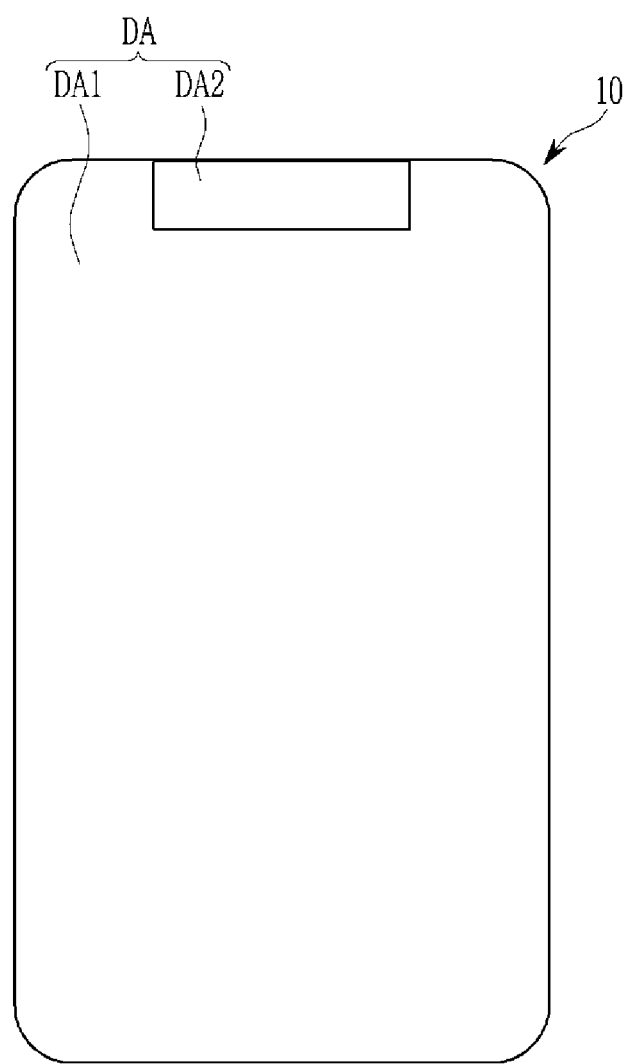
FIG. 1 illustrates a schematic top plan view of a display device according to an embodiment.

One or more embodiments of a display device disclosed herein reduce a change in a characteristic of a driving transistor of a pixel due to light.

The present invention will be described more fully hereinafter with reference to the accompanying drawings, in which embodiments of the invention are shown. As those skilled in the art would realize, the described embodiment may be modified in various different ways, all without departing from the spirit or scope of the present invention.

In order to clearly describe the present invention, parts that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

A structure of a display device according to an embodiment to which the present invention may be applied will be described with reference to FIG. 1 to FIG. 4.

Figure 2:
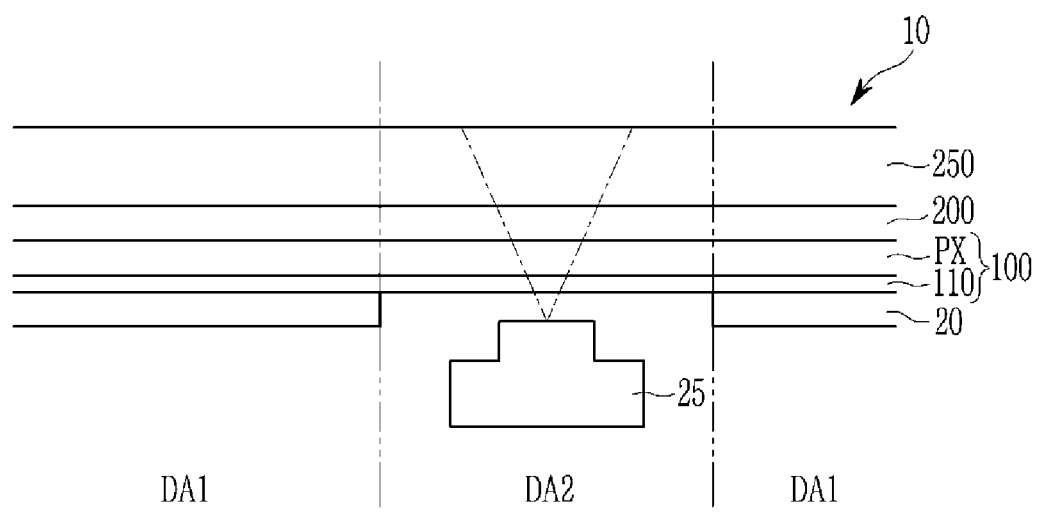
FIG. 2 illustrates a schematic cross-sectional view of a portion of the display device of FIG. 1.
Figure 3:
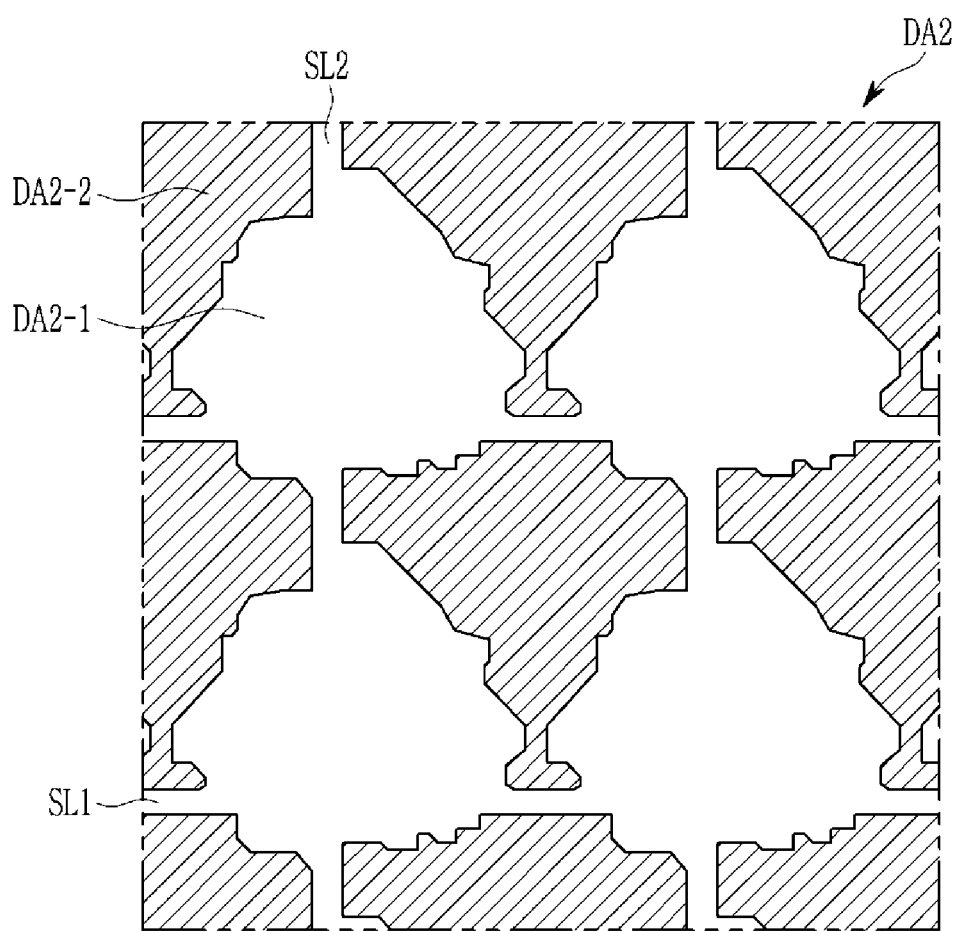
FIG. 3 illustrates an enlarged top plan view of a second display area of FIG. 1.
Figure 4:
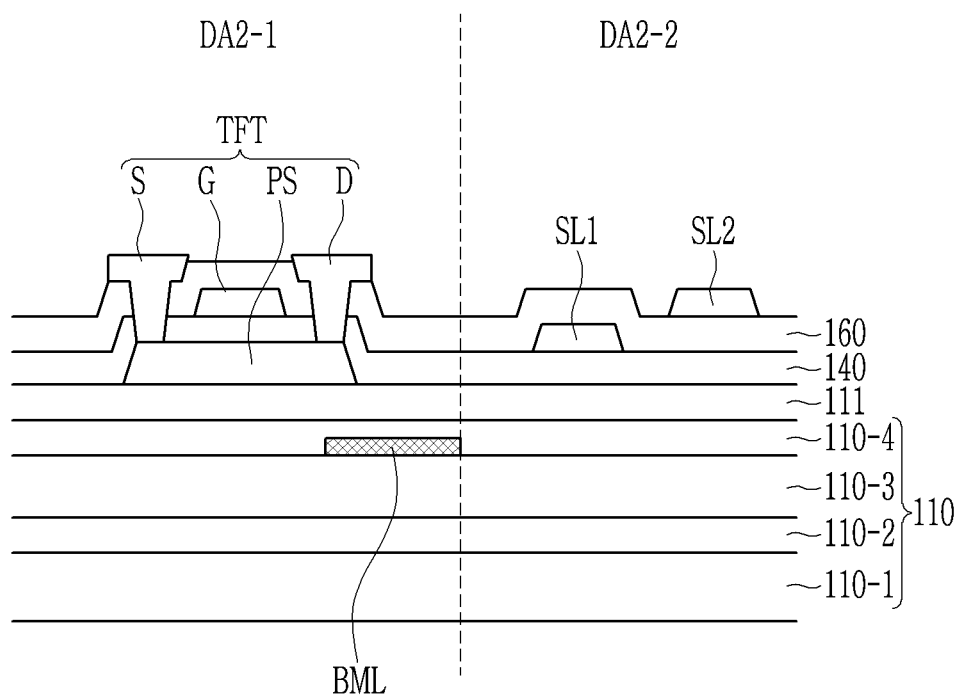
FIG. 4 illustrates an enlarged cross-sectional view of the second display area of FIG. 3.

FIG. 1 illustrates a schematic top plan view of a display device according to an embodiment, FIG. 2 illustrates a schematic cross-sectional view of a portion of the display device of FIG. 1, FIG. 3 illustrates an enlarged top plan view of a second display area of FIG. 1, and FIG. 4 illustrates an enlarged cross-sectional view of the second display area of FIG. 3.

A display device 10 according to the present embodiment includes a display panel 100, the display panel 100 is an organic light emitting panel and includes a plurality of pixels PX, and one pixel PX includes a pixel circuit part and a light emitting element part. The pixel circuit part is a part that applies a current to the light emitting element part based on a signal applied from the outside, and the light emitting element part is disposed at an upper portion of the pixel circuit part and includes an organic light emitting layer and a pair of electrodes (an anode and a cathode) disposed at respective sides of the organic light emitting layer. A current outputted by the pixel circuit part flows through the organic light emitting layer, and a degree to which the organic light emitting layer emits light varies according to an amount of the current.

The organic light emitting layer includes an organic light emitting material, and when the organic light emitting material is combined with moisture, efficiency of the organic light emitting layer is degraded. Accordingly, side and upper surfaces of the pixel circuit part and the light emitting part are sealed with an encapsulation layer to prevent moisture from penetrating from the outside. The encapsulation layer may have a structure including a plurality of layers of an organic layer and an inorganic layer, and may include a triple layer structure of an inorganic layer, an organic layer, and an inorganic layer.

In some embodiments, a touch sensing part (not shown) capable of sensing a touch may be further included at the inside of the display panel 100 or at an upper side of the display panel 100. That is, a sensing electrode capable of sensing a touch may be further formed on the encapsulation layer of the display panel 100, or a separate touch sensing substrate may be disposed on the upper portion of the display panel 100.

The display panel 100 according to the embodiment includes a display area DA including a plurality of pixels PX to display an image, and the display area DA includes a first display area DA1 and a second display area DA2. A non-display area may be disposed outside the display area DA.

The first display area DA1 is an area in which the plurality of pixels PX are continuously arranged for displaying an image, the pixel circuit part of the pixel PX may be continuously arranged along rows and columns, and the light emitting elements may be arranged in various ways. The first display area DA1 mainly displays an image, and may include a touch sensing electrode at an upper side thereof to sense a touch.

The second display area DA2 additionally serves to transmit light so that an optical element 25 disposed on the rear surface of the display panel 100 may operate, in addition to its own function of displaying an image. That is, the second display area DA2 is an area in which an empty space (transmission area DA2-2) in which no pixel PX is formed is further formed between the plurality of pixels PX.

As a result, in addition to the unique function of displaying an image by a pixel area DA2-1, the second display area DA2 may perform another function by using the optical element 25 such as a camera or infrared sensor disposed on the rear surface by using the transmissive area DA2-2. The second display area DA2 has higher transmittance than the first display area DA1 by the transmissive area DA2-2. The second display area DA2 has a density of the pixels PX, that is, the number of the pixel PX per unit area, that is smaller than that of the first display area DA1, and has a lower resolution of the displayed image than that of the first display area DA1. The second display area DA2 may also sense a touch by including a touch sensing electrode at an upper side thereof.

The shape, position, and size of the second display area DA2 in the display area DA may be variously changed. That is, unlike the shape of the second display area DA2 shown in FIG. 1, it may have various polygonal shapes such as a circular shape. In addition, a portion of the entire display area DA in which the second display area DA2 is disposed may be disposed to be close to an outer periphery of the display area DA or disposed to be close to a center thereof. A plurality of second display areas DA2 may be included, and an extending direction thereof may be a vertical direction unlike that of FIG. 1.

Referring to FIG. 1, since the second display area DA2 is disposed at one side of the first display area DA1, the first display area DA1 is not disposed at an upper portion of the second display area DA2, but in some embodiment, the second display area DA2 may be surrounded by the first display area DA1.

Referring to FIG. 2, the display device 10 may include a display panel 100, a rear passivation layer 20 disposed on a rear surface thereof, a touch sensing part 200 disposed on an upper surface thereof, and a window 250.

The rear passivation layer 20 may include a black tape, a cushion layer, and a metal layer, and includes an opening corresponding to the optical element 25. The opening of the rear passivation layer 20 corresponds to the second display area DA2. The black tape serves to block light from being upwardly provided from a rear surface, and the cushion layer prevents impact from the the rear surface from being transmitted to the display panel 100. In addition, the metal layer allows the display panel 100 to maintain a bent state when it is bent due to its flexible characteristic, and may be made of a metal such as copper (Cu) that may be easily bent.

Referring to FIG. 2, the window 250 and the touch sensing part 200 may be formed on an upper portion of the display panel 100. The window 250 serves to protect an upper surface of the display panel 100, and the touch sensing part 200 serves to sense a touch by a hand and the like to operate.

FIG. 2 briefly illustrates that various elements of the pixel PX are formed on the flexible substrate 110 of the display panel 100. The pixel PX of the display panel 100 may be covered by an encapsulation layer to be sealed to prevent moisture or air from penetrating from the outside.

Referring to FIG. 3, the second display area DA2 includes the pixel area DA2-1 and the transmissive area DA2-2, and the transmissive area DA2-2 may be separated and partitioned by wires SL1 and SL2 connected to each other by the pixel area DA2-1.

The transmissive area DA2-2 is a part that may have high transmittance to provide light to the optical element 25 disposed on the rear surface, and the pixel area DA2-1 is an area in which pixels are formed. The resolution of the second display area DA2 may be degraded due to the transmissive area DA2-2.

A polarizer may be attached to the upper surface of the display panel 100, or a color filter layer or a color conversion layer may be further formed thereon together with a black matrix. These constituent elements may serve to prevent external light from being reflected and thus prevent the upper pattern of the pixel from being viewed by a user's eye. In addition, the color filter layer or the color conversion layer may be used to improve displayed color.

For example, the optical elements 25 may include a sensor, a camera, and a flash. When the optical element 25 is a sensor, the optical element 25 may be a proximity sensor, an illuminance sensor, an infrared sensor, or an ultraviolet sensor.

FIG. 4 illustrates a schematic cross-sectional structure of the pixel area DA2-1 and the transmissive area DA2-2 of the second display area DA2 of the display panel 100.

First, a pixel circuit part including a thin film transistor TFT and a light emitting element part are formed in the pixel area DA2-1 of the second display area DA2, wherein a schematic cross-sectional structure of the thin film transistor TFT is shown.

Figure 5:
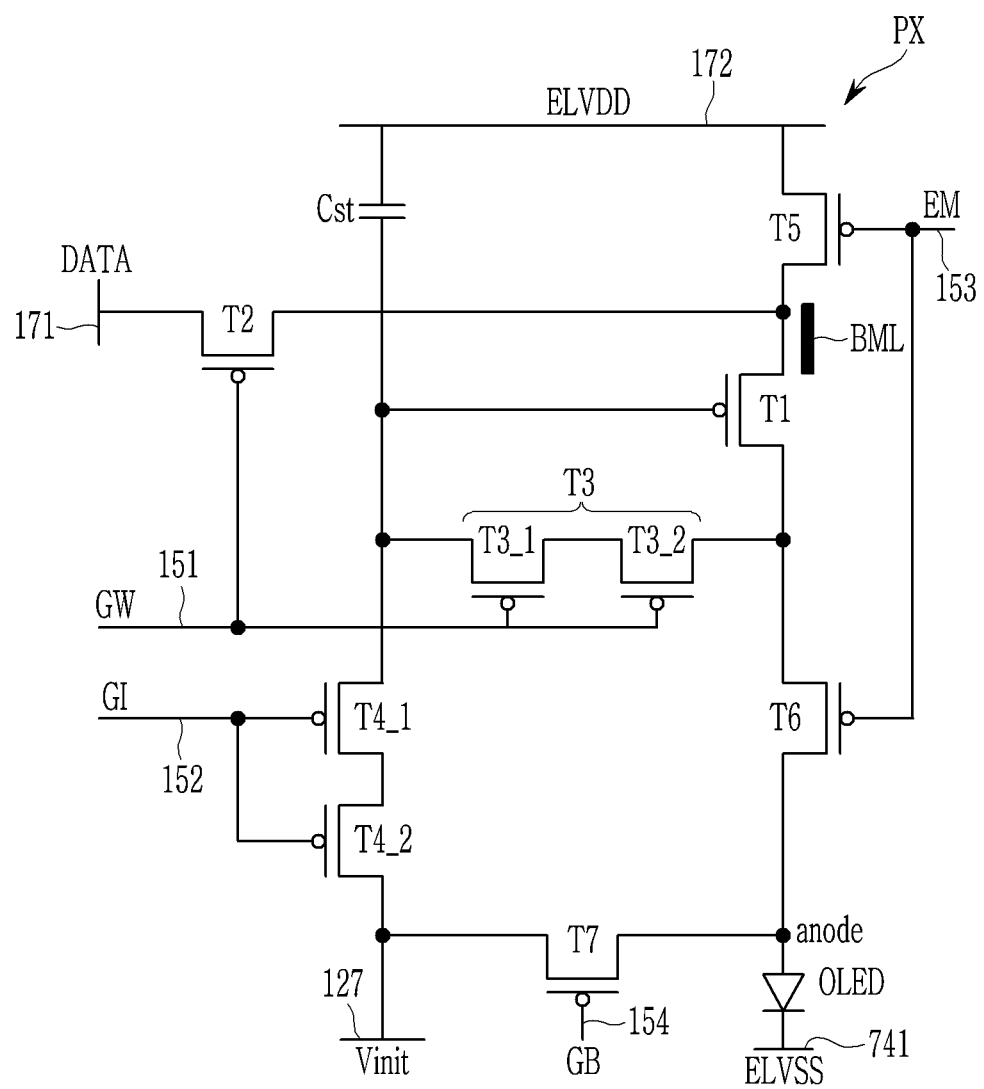
FIG. 5 illustrates a circuit diagram of one pixel included in a display device according to an embodiment.

In the thin film transistor TFT included in the pixel circuit part, a buffer layer 111 is disposed on the flexible substrate 110, and a polycrystalline semiconductor layer PS is formed on the buffer layer 111. The thin film transistor TFT may be a driving transistor T1 (FIG. 5).

The flexible substrate 110 may be formed of a plurality of layers, and includes two polyimide (PI) layers 110-1 and 110-3 and two barrier layers 110-2 and 110-4. Each of the barrier layers 110-2 and 110-4 is made of inorganic insulation materials such as a silicon nitride (SiNx), a silicon oxide (SiOx), and a silicon oxynitride (SiOxNy).

The buffer layer 111 is disposed on the upper barrier layer 110-4, and the buffer layer may be configured as a double layer. The buffer layer 111 may also be made of an inorganic insulation material, and may include a silicon nitride (SiNx), a silicon oxide (SiOx), and a silicon oxynitride (SiOxNy).

A gate insulation film 140 is disposed on the polycrystalline semiconductor layer PS, and a gate conductive layer including a gate electrode G and a first signal line SL1 is disposed thereon. The first signal line SL1 forms a boundary between the transmissive area DA2-2 and the pixel area DA2-1, so that a portion of the first signal line SL1 may be included in the transmissive area DA2-2. Although FIG. 4 shows that the gate insulation film 140 is entirely formed, in some embodiment, it may be formed only in an area in which the gate conductive layer is disposed.

The polycrystalline semiconductor layer PS overlapping the gate electrode G forms a channel of the thin film transistor, and first and second areas, which are made conductive by plasma treatment or doping, are disposed at respective sides thereof.

The gate conductive layer is covered with an interlayer insulation film 160. The interlayer insulation film 160 is made of a material such as a silicon nitride, a silicon oxide, and an aluminum oxide, and may include an organic insulation material according to embodiments.

An opening is formed in the interlayer insulation film 160 and/or the gate insulation film 140 to expose the first area and the second area of the polycrystalline semiconductor layer PS.

The data conductive layer is disposed on the interlayer insulation film 160, and the data conductive layer includes a first electrode S, a second electrode D, and the second signal line SL2.

The first electrode S is electrically connected to the first area of the polycrystalline semiconductor layer PS, and the second electrode S is electrically connected to the second area of the polycrystalline semiconductor layer PS. However, in some embodiments, as one portion of the polycrystalline semiconductor layer PS becomes conductive, it may be electrically connected to the other portion thereof without the first electrode S and the second electrode D.

The second signal line SL2 forms a boundary between the transmissive area DA2-2 and the pixel area DA2-1, so that a portion of the second signal line SL2 may be included in the transmissive area DA2-2.

In the present embodiment of the display panel 100 having such a basic structure, a bottom metal layer BML floating around a driving transistor of a pixel formed in the transmissive area DA2-2 is formed. That is, since a characteristic of the driving transistor of the pixel circuit part of the pixel that outputs a current to the light emitting element part is important, the bottom metal layer BML is formed around the driving transistor so that the characteristic of the driving transistor is not changed.

The bottom metal layer BML floating around a driving transistor T1 is formed on or within the flexible substrate 110. More specifically, the bottom metal layer BML is formed around an area where the channel of the driving transistor T1 (FIG. 5) is to be disposed, and in the embodiment of FIG. 4, in order to block light incident on the channel of the driving transistor T1 (i.e. the thin film transistor TFT) from the side surface, the bottom metal layer BML disposed at a transmission area DA2-2 side based on the channel of the driving transistor is formed. The bottom metal layer BML has a structure that does not overlap or overlaps a portion of the gate electrode of the driving transistor T1 in a plan view.

In some embodiments, the bottom metal layer BML may be applied with a voltage, and may be applied with a constant voltage such as a driving voltage ELVDD (FIG. 5), or may be connected to one electrode (for example, the first electrode or second electrode of the driving transistor) of one transistor to receive a voltage.

According to the bottom metal layer BML having the structure as shown in FIG. 4, even if the pixel is disposed in the pixel area DA2-1 of the second display area DA2 corresponding to the opening of the rear passivation layer 20 (FIG. 2), the bottom metal layer BML is formed, so that even if light is transmitted through the transmissive area DA2-2, the light is blocked by the bottom metal layer BML disposed under the channel of the driving transistor. As a result, the characteristic of the channel of the driving transistor is not changed by light.

The embodiment shown in FIG. 4 is an embodiment in which the bottom metal layer BML is formed in the flexible substrate 110, and in this case, the bottom metal layer BML is formed on the upper polyimide (PI) layer 110-3 of the flexible substrate 110, and the bottom metal layer BML is covered by the upper barrier layer 110-4.

A detailed structure of the bottom metal layer BML will be described in detail below.

First, a circuit structure thereof will be described with reference to FIG. 5.

FIG. 5 illustrates a circuit diagram of one pixel included in a display device according to an embodiment.

The pixel PX of the organic light emitting display device includes a plurality of transistors T1, T2, T3, T4, T5, T6, and T7, a storage capacitor Cst, and an organic light emitting diode OLED, which are connected to several signal lines 127, 151, 152, 153, 154, 171, 172, and 741. Here, a light emitting element is an organic light emitting diode OLED, and the transistors and the storage capacitors Cst form the pixel circuit part.

In addition, in the embodiment of FIG. 5, the bottom metal layer BML is formed to float between the driving transistor T1 and a fifth transistor T5.

The plurality of transistors T1, T2, T3, T4, T5, T6, and T7 include the driving transistor T1, and switching transistors connected to a scan line 151, that is, a second transistor T2 and a third transistor T3, and the remaining transistors (hereinafter referred to as compensation transistors) that are transistors for performing operations necessary to operate the organic light emitting diode LED. These compensation transistors T4, T5, T6, and T7 may include a fourth transistor T4, the fifth transistor T5, a sixth transistor T6, and a seventh transistor T7.

The plurality of signal lines 127, 151, 152, 153, 154, 171, 172, and 741 may include the scan line 151, a previous scan line 152, an emission control line 153, a bypass control line 154, a data line 171, a driving voltage line 172, an initialization voltage line 127, and a common voltage line 741. The bypass control line 154 may be a portion of the previous scan line 152, or may be electrically connected thereto.

The scan line 151 is connected to a gate driver (not shown) to transmit a scan signal GW to the switching transistors, that is, to the second transistor T2 and the third transistor T3. The previous scan line 152 may be connected to a gate driver to transmit a previous scan signal GI applied to the pixel PX disposed at a previous stage to the fourth transistor T4. Since the fourth transistor T4 includes two transistors connected in series, the previous scan signal GI is applied to both of the gate electrodes of the two serially connected transistors included in the fourth transistor T4. The emission control line 153 is connected to an emission controller (not shown), and it transmits an emission control signal EM that controls an emission time of the organic light emitting diode OLED to the fifth transistor T5 and the sixth transistor T6. The bypass control line 154 transmits a bypass signal GB to the seventh transistor T7, and in some embodiment, it may transmit the same signal as the previous scan signal GI.

The data line 171 is a wire that transmits a data voltage DATA generated by a data driver (not shown), and luminance at which the organic light emitting diode OLED (also referred to as an 'organic light emitting element') emits light is changed according to the data voltage DATA. The driving voltage line 172 applies a driving voltage ELVDD, the initialization voltage line 127 transmits an initialization voltage Vint for initializing the driving transistor T1, and the common voltage line 741 applies a common voltage ELVSS. Voltages applied to the driving voltage line 172, the initialization voltage line 127, and the common voltage line 741 may be constant.

Hereinafter, a plurality of transistors will be described.

First, the driving transistor T1 is a transistor that adjusts an amount of current outputted according to the data voltage DATA applied thereto, and the output current is applied to an anode (anode) of the organic light emitting diode OLED to adjust brightness of the organic light emitting diode OLED according to the data voltage DATA. For this purpose, a first electrode of the driving transistor T1 is disposed to receive the driving voltage ELVDD, and is connected to the driving voltage line 172 via the fifth transistor T5. In addition, the first electrode of the driving transistor T1 is connected to a second electrode of the second transistor T2 to receive the data voltage DATA. Meanwhile, a second electrode of the driving transistor T1 is disposed to output a current toward the organic light emitting diode OLED, and is connected to the anode (anode) of the organic light emitting diode OLED via the sixth transistor T6. Meanwhile, a gate electrode of the driving transistor T1 is connected to one electrode of the storage capacitor Cst (hereinafter referred to as a second storage electrode). Accordingly, a voltage of the gate electrode of the driving transistor T1 is changed according to a voltage stored in the storage capacitor Cst, and accordingly, a current outputted from the driving transistor T1 is changed.

The second transistor T2 is a transistor that allows the data voltage DATA to be received into the pixel PX. A gate electrode of the second transistor T2 is connected to the scan line 151, and a first electrode of the second transistor T2 is connected to the data line 171. A second electrode of the second transistor T2 is connected to the first electrode of the driving transistor T1. When the second transistor T2 is turned on according to the scan signal GW transmitted through the scan line 151, the data voltage DATA transmitted through the data line 171 is transmitted to the first electrode of the driving transistor T1.

The third transistor T3 is a transistor that allows a compensation voltage (DATA-Vth) that is changed as the data voltage DATA passes through the driving transistor T1 to be transmitted to the second storage electrode of the storage capacitor Cst. The third transistor T3 may be a transistor unit that includes a transistor T3_1 and a transistor T3_2 that are connected in series. Both gate electrodes of the two transistors T3_1 and T3_2 are connected to the scan line 151. A first electrode of the transistor T3_2 is connected to the second electrode of the driving transistor T1, and a second electrode of the transistor T3_1 is connected to the second storage electrode of the storage capacitor Cst and the gate electrode of the driving transistor T1. In addition, a first electrode of the transistor T3_1 and a second electrode of the transistor T3_2 are connected to each other. When third transistor T3 is described as one transistor, the first electrode of the transistor T3_2 becomes the first electrode of the third transistor T3, and the second electrode of the transistor T3_1 becomes the second electrode of the third transistor T3. The third transistor T3 is turned on according to the scan signal GW received through the scan line 151 to connect the gate electrode and the second electrode of the driving transistor T1 and to connect the second electrode of the driving transistor T1 and the second storage electrode of the storage capacitor Cst.

An operation in which a voltage of the threshold voltage Vth of the driving transistor T1 compensated by the second transistor T2 and the third transistor T3 is stored in the storage capacitor Cst will be described in detail as follows.

When a low level scan signal GW is supplied to the pixel PX through the scan line 151, the second transistor T2 and the third transistor T3 are turned on, and the data voltage DATA passes through the second transistor T2 by the second transistor T2 to be inputted to the first electrode of the driving transistor T1.

In this case, since the voltage of the gate electrode of the driving transistor T1 initialized by the initialization voltage Vinit turns on the driving transistor T1, the inputted data voltage DATA is transmitted to the third transistor T3, and since the third transistor T3 is also turned on by the scan signal GW, the inputted data voltage DATA is transmitted to the storage capacitor Cst.

As the data voltage DATA is transmitted, the voltage of the gate electrode of the driving transistor T1 (that is, the voltage stored in the storage capacitor Cst) increases, and when the voltage of the gate electrode of the driving transistor T1 is a voltage of "DATA-Vth", as the driving transistor T1 is turned off, the voltage at this time is stored and maintained in the storage capacitor Cst.

The fourth transistor T4 serves to initialize the gate electrode of the driving transistor T1 and the second storage electrode of the storage capacitor Cst. A gate electrode of the fourth transistor T4 is connected to the previous scan line 152, and a first electrode of the fourth transistor T4 is connected to the initialization voltage line 127. A second electrode of the fourth transistor T4 is connected to the second storage electrode of the storage capacitor Cst and the gate electrode of the driving transistor T1 via the second electrode of the third transistor T3. The fourth transistor T4 also has a structure including two transistors connected in series. The fourth transistor T4 transmits the initialization voltage Vint to the gate electrode of the driving transistor T1 and the second storage electrode of the storage capacitor Cst according to the previous scan signal GI received through the previous scan line 152. Accordingly, a gate voltage of the gate electrode of the driving transistor T1 and the storage capacitor Cst are initialized. The initialization voltage Vint may have a low voltage value, and it may be a voltage capable of turning on the driving transistor T1.

The fifth transistor T5 serves to transmit the driving voltage ELVDD to the driving transistor T1. A gate electrode of the fifth transistor T5 is connected to the emission control line 153, and a first electrode of the fifth transistor T5 is connected to the driving voltage line 172. A second electrode of the fifth transistor T5 is connected to the first electrode of the driving transistor T1.

The sixth transistor T6 serves to transmit a current outputted from the driving transistor T1 to the organic light emitting diode OLED. A gate electrode of the sixth transistor T6 is connected to the emission control line 153, and a first electrode of the sixth transistor T6 is connected to the second electrode of the driving transistor T1. The second electrode of the sixth transistor T6 is connected to the anode (anode) of the organic light emitting diode OLED.

The fifth transistor T5 and the sixth transistor T6 are simultaneously turned on according to the emission control signal EM transmitted through the emission control line 153, and when the driving voltage ELVDD is applied to the first electrode of the driving transistor T1 through the fifth transistor T5, the driving transistor T1 outputs a current according to the voltage of the gate electrode of the driving transistor T1 (that is, the voltage of the second storage electrode of the storage capacitor Cst). The outputted current is transmitted to the organic light emitting diode OLED through the sixth transistor T6. As a current flows through the organic light emitting diode OLED, the organic light emitting diode OLED emits light.

The seventh transistor T7 serves to initialize the anode (anode) of the organic light emitting diode OLED. A gate electrode of the seventh transistor T7 is connected to the bypass control line 154, a first electrode of the seventh transistor T7 is connected to the anode (anode) of the organic light emitting diode OLED, and a second electrode of the seventh transistor T7 is connected to the initialization voltage line 127. The bypass control line 154 may be connected to the previous scan line 152, and the bypass signal GB is applied as the same timing signal as the previous scan signal GI. The bypass control line 154 may not be connected to the previous scan line 152 to transmit a separate signal from the previous scan signal GI. When the seventh transistor T7 is turned on according to the bypass signal GB, the initialization voltage Vint is applied to the anode (anode) of the organic light emitting diode OLED, so that the organic light emitting diode OLED is initialized.

A first storage electrode of the storage capacitor Cst is connected to the driving voltage line 172, and the second storage electrode thereof is connected to the gate electrode of the driving transistor T1, the second electrode of the third transistor T3, and the second electrode of the fourth transistor T4. Accordingly, the second storage electrode determines the voltage of the gate electrode of the driving transistor T1, and it receives the data voltage DATA through the second electrode of the third transistor T3 or receives the initial voltage Vint through the second electrode of the fourth transistor T4.

Meanwhile, the anode of the organic light emitting diode OLED is connected to the second electrode of the sixth transistor T6 and the first electrode of the seventh transistor T7, and the cathode thereof is connected to the common voltage line 741 that transmits the common voltage ELVSS.

In the embodiment of FIG. 1, the pixel circuit includes seven transistors T1 to T7 and one capacitor Cst, but is not limited thereto, and the number of transistors, the number of capacitors, and their connections may be variously changed.

In addition, in the embodiment of FIG. 5, the bottom metal layer BML is formed around the driving transistor T1 and at the fifth transistor T5 side. The bottom metal layer BML in the circuit diagram is mainly shown in the floating state, while a detailed structure of the bottom metal layer BML will be described in detail with reference to FIG. 6 and FIG. 7.

Figure 6:
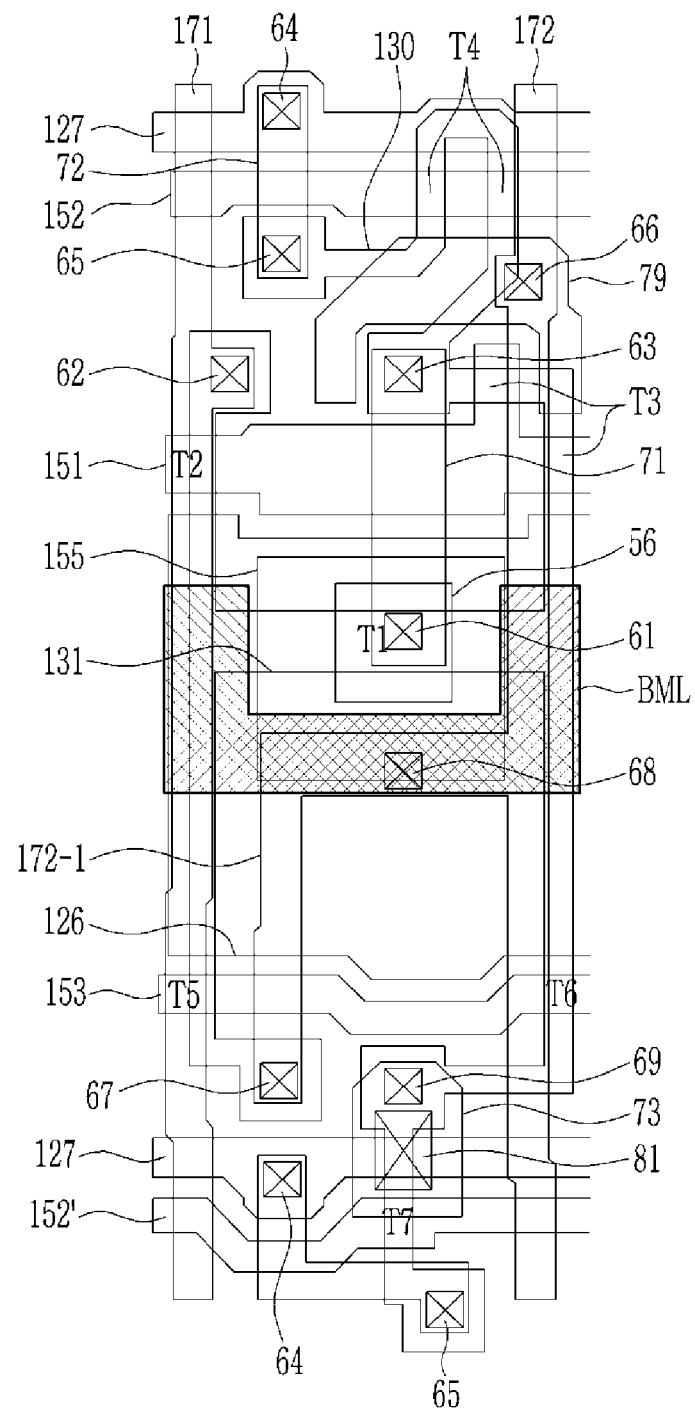
FIG. 6 illustrates a layout view of a pixel according to an embodiment.
Figure 7:
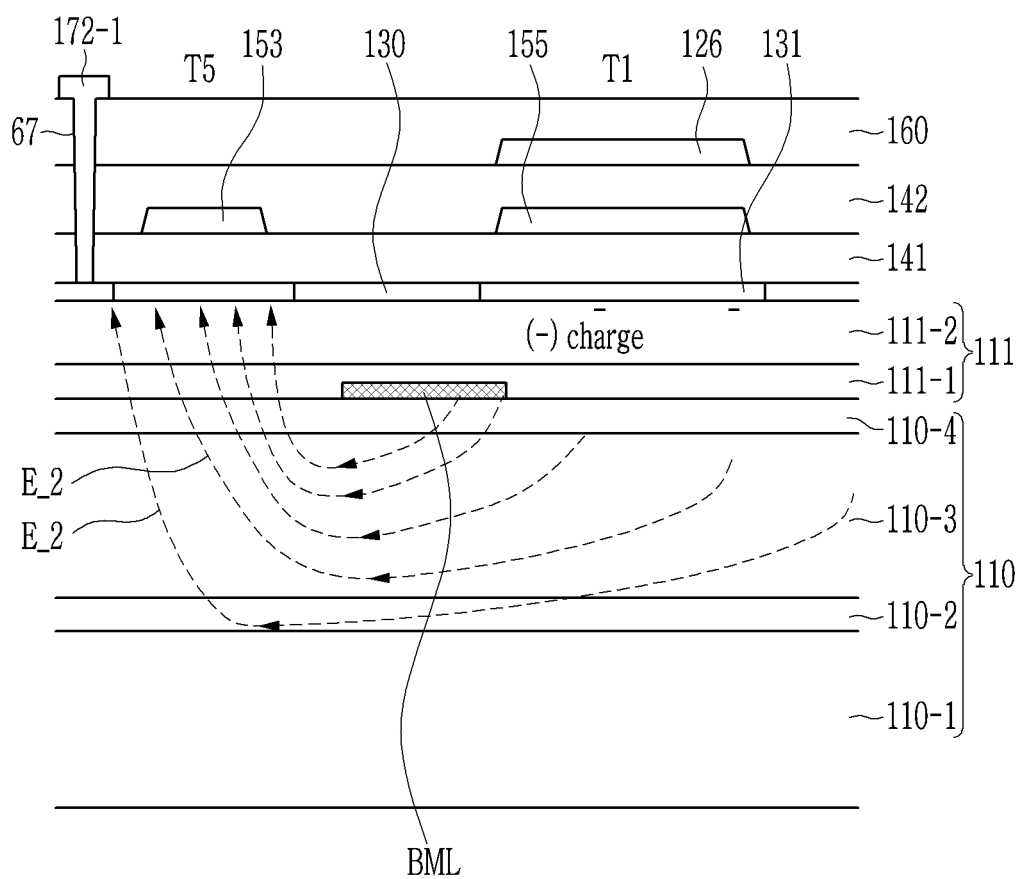
FIG. 7 illustrates a cross-sectional view around a driving transistor according to an embodiment.

FIG. 6 illustrates a layout view of a pixel according to an embodiment, and FIG. 7 illustrates a cross-sectional view around a driving transistor according to an embodiment.

In the organic light emitting display device according to the embodiment, the scan line 151, the previous scan line 152, the emission control line 153, and the initialization voltage line 127, which mainly extend along a first direction, are formed. Meanwhile, the organic light emitting display device includes the data line 171 and the driving voltage line 172 that extend along a second direction crossing the first direction, and transmit the data voltage DATA and the driving voltage ELVDD, respectively.

In the present embodiment, it is shown that the bottom metal layer BML is disposed at an upper portion of the driving transistor T1, that is, a fifth transistor T5 side and a sixth transistor T6 side, and the bottom metal layer BML has linear structures at the left and right sides. The bottom metal layer BML as shown in FIG. 6 may have a structure in which a linear structure of one side (upper side) is removed from a rectangular bottom metal layer BML having a rectangular opening. In FIG. 6, the bottom metal layer BML has a structure in which a linear structure of a second transistor T2 side and/or a third transistor T3 side is removed.

Referring to FIG. 7, the bottom metal layer BML is formed on the flexible substrate 110, and is covered with the buffer layer 111.

Hereinafter, an overall structure of FIG. 6 and FIG. 7 will be described.

Each of the channels of the driving transistor T1, the second transistor T2, the third transistor T3, the fourth transistor T4, the fifth transistor T5, the sixth transistor T6, and the seventh transistor T7 is disposed within a semiconductor layer 130 that extends long. In addition, at least portions of the first and second electrodes of the plurality of transistors T1, T2, T3, T4, T5, T6, and T7 are also disposed in the semiconductor layer 130.

Unlike the structure of FIG. 3, the semiconductor layer 130 may be formed to have various bent shapes. The semiconductor layer 130 is made of a polycrystalline semiconductor such as polysilicon.

The semiconductor layer 130 becomes conductive through plasma treatment or doping, except for the channel of each transistor, and first and second areas are formed at respective sides of the channel. The conductive first and second areas may serve as first and second electrodes of the plurality of transistors T1, T2, T3, T4, T5, T6, and T7, respectively. In addition, a portion of the semiconductor layer 130 may be conductive to directly connect different transistors.

Each of the channels of the plurality of transistors T1, T2, T3, T4, T5, T6, and T7 overlaps the gate electrode of each transistor T1, T2, T3, T4, T5, T6, or T7, and is disposed between the first and second areas of each transistor T1, T2, T3, T4, T5, T6, or T7. The plurality of transistors T1, T2, T3, T4, T5, T6, and T7 may have a substantially same stacked structure. Hereinafter, the driving transistor T1 will be mainly described in detail, and the remaining transistors T2, T3, T4, T5, T6, and T7 will be briefly described.

The driving transistor T1 includes a channel 131, a gate electrode 155, and the first area and the second area. The channel 131 of the driving transistor T1 is between the first area and the second area, and overlaps the gate electrode 155 in a plan view. The channel 131 may have a bent structure, and in some embodiments, it may have a straight line structure, and the shape of the channel 131 may be various without being limited to the illustrated Ω shape.

An extended portion of a storage line 126 is isolated and disposed on the gate electrode 55. The extended portion of the storage line 126 overlaps the gate electrode 155 in a plan view with a second gate insulation film 142 therebetween to form the storage capacitor Cst. The extended portion of the storage line 126 is the first electrode of the storage capacitor Cst, and the gate electrode 155 is the second storage electrode thereof. The extended portion of the storage line 126 is provided with an opening 56 formed so that the gate electrode 155 may be connected to the first data connection member 71. In the opening 56, an upper surface of the gate electrode 155 and the first data connection member 71 are electrically connected to each other through the opening 61. The first data connection member 71 is connected to the second area of the third transistor T3 to connect the gate electrode 155 of the driving transistor T1 and the second area of the third transistor T3.

The gate electrode of the second transistor T2 may be a portion of the scan line 151. The data line 171 is connected to the first area of the second transistor T2 through an opening 62, and the first area and the second area may be disposed on the semiconductor layer 130.

The third transistor T3 includes two transistors T3_1 and T3_2 that are adjacent to each other and connect in series. The third transistor T3 serves to be connected in series to block a leakage current from flowing. When the structure in which the two transistors are connected in series is simply described as one third transistor T3, it may be described that the first area of the third transistor T3 is directly connected to the first area of the sixth transistor T6 and the second area of the driving transistor T1. In addition, the second area of the third transistor T3 is connected to the first data connection member 71 through an opening 63.

The fourth transistor T4 is also configured as two fourth transistors T4 connected in series, and channels of the two fourth transistors T4 are formed at a portion in which the previous scan line 152 and the semiconductor layer 130 meet. The gate electrode of the fourth transistor T4 may be a portion of the previous scan line 152. The first area of one fourth transistor T4 is connected to the second area of the other fourth transistor T4. The structure connected in series as described above may serve to block a leakage current. A second data connection member 72 is connected to the first area of the fourth transistor T4 through an opening 65, and the second data connection member 71 is connected to the second area of the fourth transistor T4 through the opening 63.

The gate electrode of the fifth transistor T5 may be a portion of the emission control line 153. The driving voltage line 172 is connected to the first area of the fifth transistor T5 through an opening 67, and the second area thereof is connected to the first area of the driving transistor T1 through the semiconductor layer 130.

The gate electrode of the sixth transistor T6 may be a portion of the emission control line 153. A third data connection member 73 is connected to the second area of the sixth transistor T6 through an opening 69, and the first area thereof is connected to the second area of the driving transistor through the semiconductor layer 130.

The gate electrode of the seventh transistor T7 may be a portion of the previous scan line 152. The third data connection member 73 is connected to the first area of the seventh transistor T7 through an opening 81, and the second area thereof is connected to the first area of the fourth transistor T4.

The storage capacitor Cst includes the first storage electrode and the second storage electrode overlapping each other with the second gate insulation film 142 interposed therebetween, the second storage electrode may correspond to the gate electrode 155 of the driving transistor T1, and the first storage electrode may be the extended portion of the storage line 126. Here, the second gate insulation film 142 becomes a dielectric, and capacitance is determined by the charge stored in the storage capacitor Cst and the voltage between the first and second storage electrodes. By using the gate electrode 155 as the second storage electrode, it is possible to secure a space to form the storage capacitor Cst in a space that is narrowed due to the channel of the driving transistor T1, which occupies a large area within the pixel.

The driving voltage line 172 is connected to the first storage electrode through an opening 68. Therefore, the storage capacitor Cst stores a charge corresponding to a difference between the driving voltage ELVDD transmitted to the first storage electrode through the driving voltage line 172 and the gate voltage of the gate electrode 155.

The second data connection member 72 is connected to the initialization voltage line 127 through an opening 64. A pixel electrode referred to as a pixel electrode is connected to the third data connection member 73 through the opening 81.

Hereinafter, an overall cross-sectional structure of an organic light emitting display device according to an embodiment will be described according to a stacking order with reference to FIG. 7.

The organic light emitting display device according to the embodiment uses the substrate 110 made of a flexible material such as plastic or polyimide (PI). The barrier layers 110-2 and 110-4 are disposed on the substrate 110, and the bottom metal layer BML made of a metal having conductivity or a semiconductor material having a conductive characteristic equivalent to that is disposed on the barrier layers 110-2 and 110-4. The buffer layer 111 is disposed on the bottom metal layer BML.

In the embodiment of FIG. 7, the buffer layer 111 is also configured as a double layer, the lower buffer layer 111-1 covers the bottom metal layer BML, and the upper buffer layer 111-2 covers the lower buffer layer 111-1. The barrier layers 110-2 and 110-4 and the buffer layers 111-1 and 111-2 may include inorganic insulation materials such as a silicon oxide, a silicon nitride, and an aluminum oxide.

The semiconductor layer 130 including the channel 131 of the driving transistor T1, the channels of the transistors T2, T3, T4, T5, T6, and T7, and the first and second areas disposed at respective sides of the channel are disposed on the buffer layer 111

A first gate insulation film 141 covering the semiconductor layer 130 is disposed thereon. The first gate insulation film 141 may be made of an inorganic insulation material such as a silicon oxide, a silicon nitride, or an aluminum oxide.

A first gate conductor including the gate electrodes of the plurality of transistors T1, T2, T3, T4, T5, T6, and T7, the scan line 151, the previous scan line 152, and the emission control line 153 is disposed on the first gate insulation film 141. The gate electrode 155 of the driving transistor T1 and the gate electrode of the fifth transistor T5, which is a part of the emission control line 153, are shown in FIG. 7.

The second gate insulation film 142 is disposed on the first gate conductor to cover the first gate conductor. The second gate insulation film 142 may be made of a material such as a silicon nitride, a silicon oxide, and an aluminum oxide.

A second gate conductor including the storage line 126, the first storage electrode, the initialization voltage line 127, and a parasitic capacitor control pattern 79 is disposed on the second gate insulation film 142. The first storage electrode is shown in FIG. 7.

The interlayer insulation film 160 is disposed on the second gate conductor to cover the second gate conductor. The interlayer insulation film 160 may be made of a material such as a silicon nitride, a silicon oxide, and an aluminum oxide, and may be made of an organic insulation material.

A data conductor including the data line 171, the driving voltage line 172, the first data connection member 71, the second data connection member 72, and the third data connection member 73 is disposed on the interlayer insulation film 160. In FIG. 7, a connection portion 172-1 of the driving voltage line 172 is shown, and the driving voltage ELVDD is transmitted to one area of the fifth transistor T5 through the opening 67 and the connection portion 172-1.

A passivation film (not shown) is disposed on the data conductor to cover it. The passivation layer, which is also referred to as a planarization film, may include an organic insulation material.

The pixel electrode (not shown) and/or anode electrode (not shown) are disposed on the passivation film. The pixel electrode and/or anode electrode is connected to the third data connection member 73 through the opening 81 formed in the passivation film. A partition wall (not shown) is disposed on the anode, and the anode is exposed through the opening disposed on the partition wall. The organic light emitting layer is within the opening of the partition wall and is disposed on the anode, and the cathode is disposed on the organic light emitting layer and the partition wall. The anode, the organic light emitting layer, and the cathode form the organic light emitting diode OLED.

The scan line 151, the previous scan line 152, and the emission control line 153, which are formed with the first gate conductor, are extended in the first direction, and the storage line 126 and the initialization voltage line 127, which are formed with the second gate conductor, are also extended in the first direction. Meanwhile, the data line 171 and the driving voltage line 172 formed with the data conductor are extended in the second direction.

The data line 171 is connected to the first area of the second transistor T2 through the opening 62 formed in the first gate insulation film 141, the second gate insulation film 142, and the interlayer insulation film 160.

The driving voltage line 172 connected to the first area of the fifth transistor T5 through the opening 67 formed in the first gate insulation film 141, the second gate insulation film 142, and the interlayer insulation film 160, is connected to the extended portion (first storage electrode) of the storage line 126 through the opening 68 formed in the interlayer insulation film 160, and is connected to the parasitic capacitor control pattern 79 through an opening 66 formed in the interlayer insulation film 160.

One end of the first data connection member 71 is connected to the gate electrode 155 through the opening 61 formed in the second gate insulation film 142 and the interlayer insulation film 160, and the other end thereof is connected to the second area of the third transistor T3 and the second area of the fourth transistor T4 through the opening 63 formed in the first gate insulation film 141, the second gate insulation film 142, and the interlayer insulation film 160.

One end of the second data connection member 72 is connected to the first area of the fourth transistor T4 through the opening 65 formed in the first gate insulation film 141, the second gate insulation film 142, and the interlayer insulation film 160, and the other end thereof is connected to the initialization voltage line 127 through the opening 64 formed in the interlayer insulation film 160.

The third data connection member 73 is connected to the second area of the sixth transistor T6 through the opening 69 formed in the first gate insulation film 141, the second gate insulation film 142, and the interlayer insulation film 160.

Although not shown, an encapsulation layer (not shown) protecting the organic light emitting diode OLED is disposed on the cathode. The encapsulation layer may be a thin film encapsulation layer in which an inorganic film and an organic film are stacked, and may include a triple layer formed of an inorganic film, an organic film, and an inorganic film.

Figure 8:
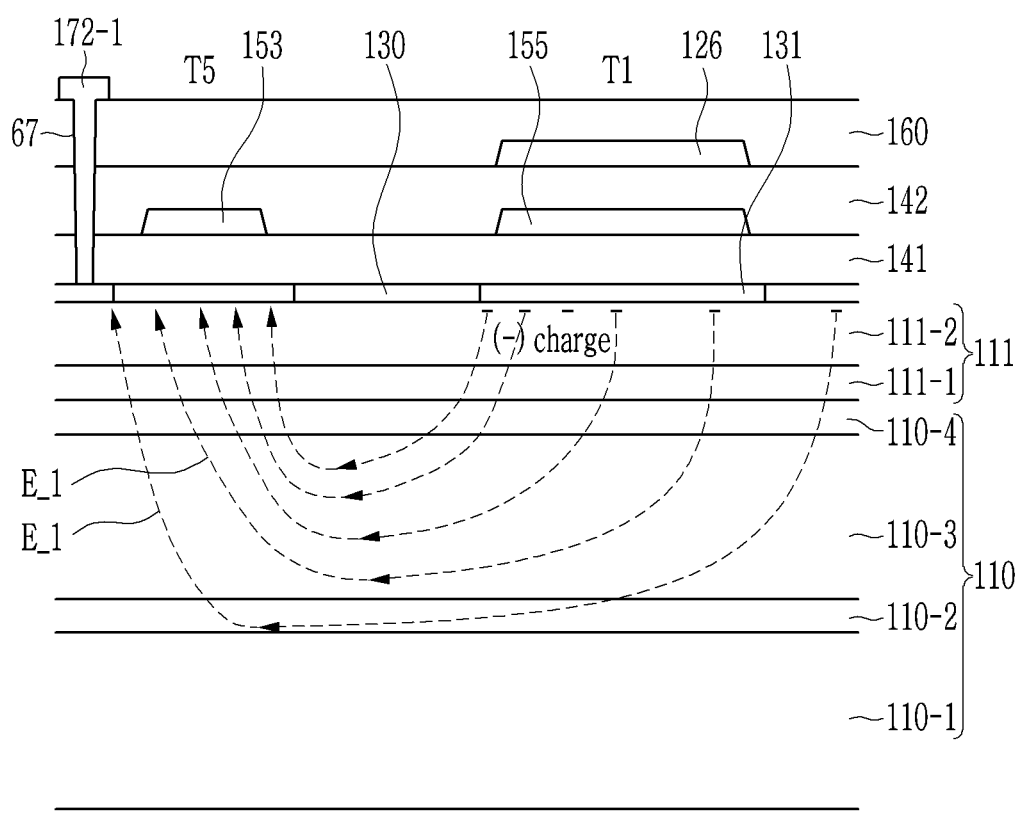
FIG. 8 illustrates a cross-sectional view around a driving transistor according to a comparative example.

In FIG. 7, the feature of the bottom metal layer BML is additionally illustrated, which will be compared with a comparative example shown in FIG. 8.

FIG. 8 illustrates a cross-sectional view around a driving transistor according to a comparative example.

The comparative example shown in FIG. 8 has a structure in which no bottom metal layer BML is included in the pixel disposed in the second display area DA2.

Comparing FIG. 7 with FIG. 8, there is a difference in the number of negative charges ((−) charge) caused under the channel 131 of the driving transistor T1.

In the second display area DA2, light is introduced from the rear surface through the opening for the optical element 25 disposed on the rear passivation layer 20. The light introduced as described above induces a negative charge in a lower portion of the channel 131 of the driving transistor T1 due to the substrate 110 including a polyimide (PI). The negative charge produces an electric field E_1.

However, in the present embodiment as shown in FIG. 7, as a magnitude of an electric field E_2 near the driving transistor T1 caused by light introduced from the rear surface through the opening for the optical element 25 is reduced due to the bottom metal layer BML. Another way of viewing this, as shown comparing FIGS. 7 and 8, is that the negative charge produced under the channel 131 of the driving transistor T1 is reduced by the bottom metal layer BML.

In addition, in the comparative example of FIG. 8, it can be seen that due to a power line formed to the fifth transistor T5 from the negative charge formed under the driving transistor T1, characteristics of the channel of the driving transistor T1 may be changed by a voltage change of the emission signal EM applied to the fifth transistor T5.

However, in FIG. 7, due to the bottom metal layer BML, the electric field between the driving transistor T1 and the fifth transistor T5 is not connected to the channel of the driving transistor T1, and is blocked by the bottom metal layer BML. As a result, the characteristic of the channel of driving transistor T1 is not changed even when the voltage of the fifth transistor T5 therearound is changed.

Hereinafter, an embodiment in which a layer position in which the bottom metal layer BML is formed is changed will be described with reference to FIG. 9.

Figure 9:
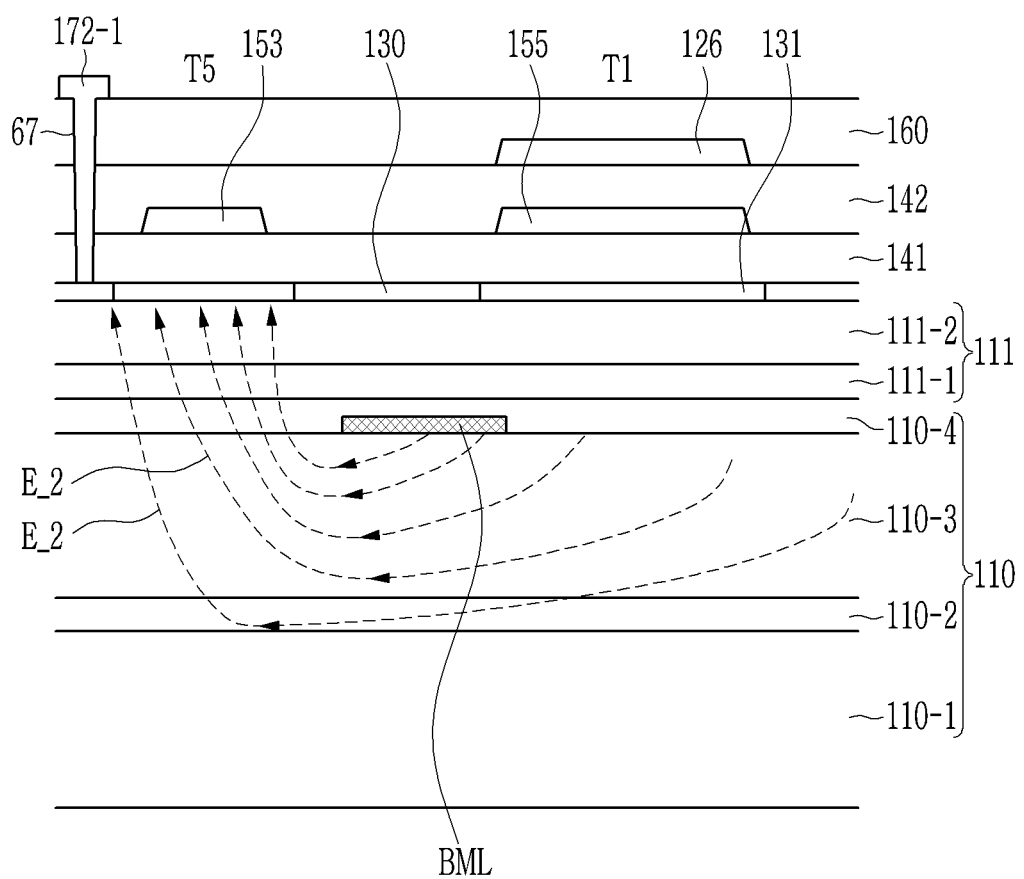
FIG. 9 illustrates a cross-sectional view around a driving transistor according to another embodiment.

FIG. 9 illustrates a cross-sectional view around a driving transistor according to another embodiment.

Unlike FIG. 7, the bottom metal layer BML according to the embodiment of FIG. 9 is disposed inside the flexible substrate 110, and the bottom metal layer BML is formed on the upper polyimide (PI) layer 110-3, and the bottom metal layer BML is covered by the upper barrier layer 110-4.

Even in the embodiment, since the electric field may not be applied to the channel of the driving transistor T1 and light may not be applied to the channel by the bottom metal layer BML, the characteristic change of the driving transistor T1 decreases.

Meanwhile, in FIG. 10, a planar structure of the bottom metal layer BML will be described based on a unit pixel.

Figure 10:
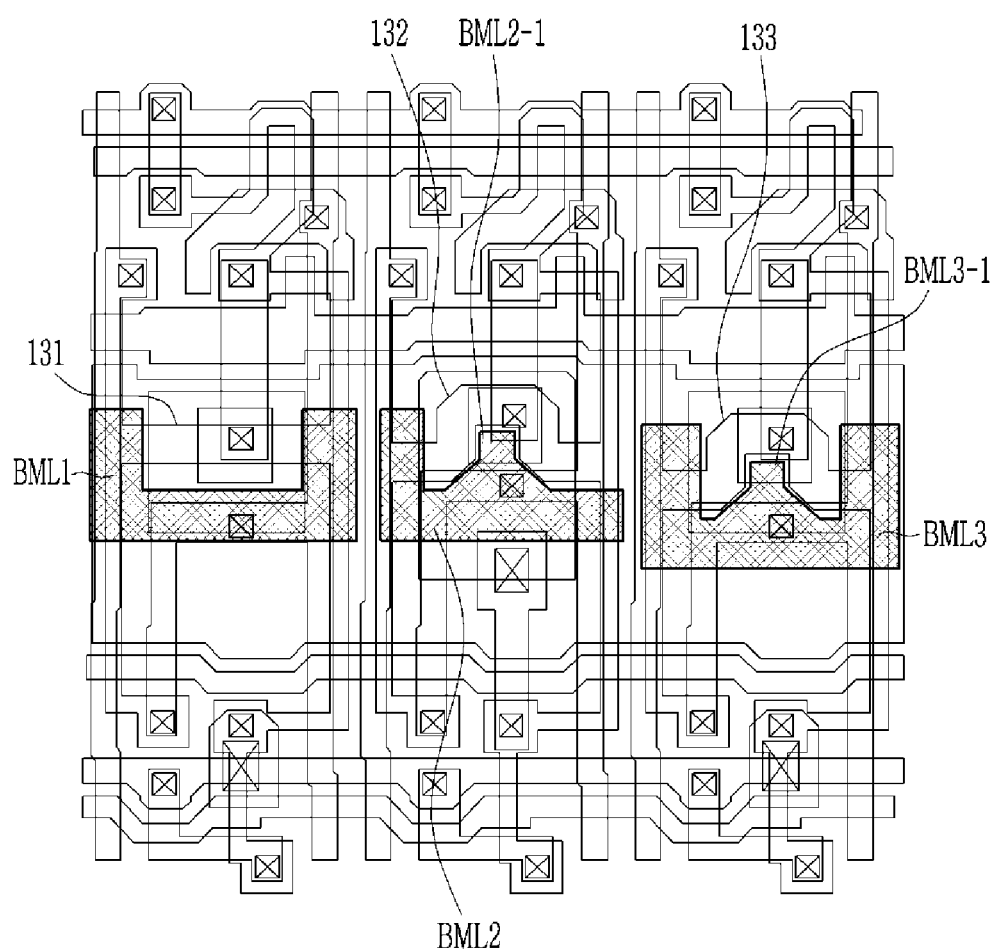
FIG. 10 illustrates a layout view of a unit pixel according to another embodiment.

FIG. 10 illustrates a layout view of a unit pixel according to another embodiment.

In FIG. 10, three pixels are shown, respective three pixels form three color pixels, and one unit pixel is formed by combining these three color pixels.

The unit pixel shown in FIG. 10 is a unit pixel disposed in the pixel area DA2-1 of the second display area DA2, the channel 131 of the driving transistor T1 of one of the three pixels has a linear structure, and the channels 131 of the driving transistors T1 of the remaining two thereof have an Ω shape.

Generally, considering that the pixel disposed in the first display area DA1 has an Ω shape from the pixels of all colors to the channel 131 of the driving transistor T1 to have a long channel, the pixel formed in the pixel area DA2-1 of the second display area DA2 is designed to have a structure of another channel 131 according to a color.

FIG. 10 illustrates that in each color pixel, bottom metal layers BML1, BML2, and BML3 have different structures according to the structure of the other channel 131.

First, in the present embodiment, a leftmost pixel is a blue pixel, a middle pixel is a green pixel, and a rightmost pixel is a red pixel.

The blue pixel has a linear structure in which the channel 131 of the driving transistor T1 extends in the first direction. The bottom metal layer BML1 corresponding thereto also includes a linear portion corresponding to the channel 131 of the driving transistor T1, and the linear portion is disposed between the channel 131 and the fifth transistor T5 or the sixth transistor T6 in a plan view. In addition, the bottom metal layer BML1 may further include vertical portions respectively extending upwardly from respective sides of the linear portion.

In contrast, in the green pixel, a channel 132 of the driving transistor T1 has an Ω shape, and the bottom metal layer BML2 includes a protrusion BML2-1 corresponding to the shape of the channel 132. That is, the linear portion of the bottom metal layer BML2 of the green pixel is additionally provided with the protrusion BML2-1 corresponding to the shape of the channel 132, and one end portion thereof is provided with a vertical portion extending upwardly.

Meanwhile, in the red pixel, a channel 133 of the driving transistor T1 has an Ω shape, and the bottom metal layer BML3 includes a protrusion BML3-1 corresponding to the shape of the channel 133. That is, the linear portion of the bottom metal layer BML3 of the red pixel is additionally provided with the protrusion BML3-1 corresponding to the shape of the channel 133, and both end portions thereof are provided with vertical portions extending upwardly.

As shown in FIG. 10, the bottom metal layer has the shape corresponding to the shape of the channel 133 of the driving transistor T1, and at least one of the ends of respective sides may include the vertical portion.

As such, the structural difference may be determined based on a degree to which the channel characteristic of each driving transistor T1 is actually affected, and thus, a structure in which light may be more efficiently blocked is formed.

The bottom metal layers BML1, BML2, and BML3 are disposed between the substrate 110 and the polycrystalline semiconductor layer in a stacked structure, and in some embodiments, they may be disposed within the substrate 110 having a plurality of layers. In addition, the bottom metal layers BML1, BML2, and BML3 are floating, and in some embodiments, they may be applied with a certain voltage.

Hereinafter, a modified embodiment will be described with reference to FIG. 11 to FIG. 13.

Figure 11:
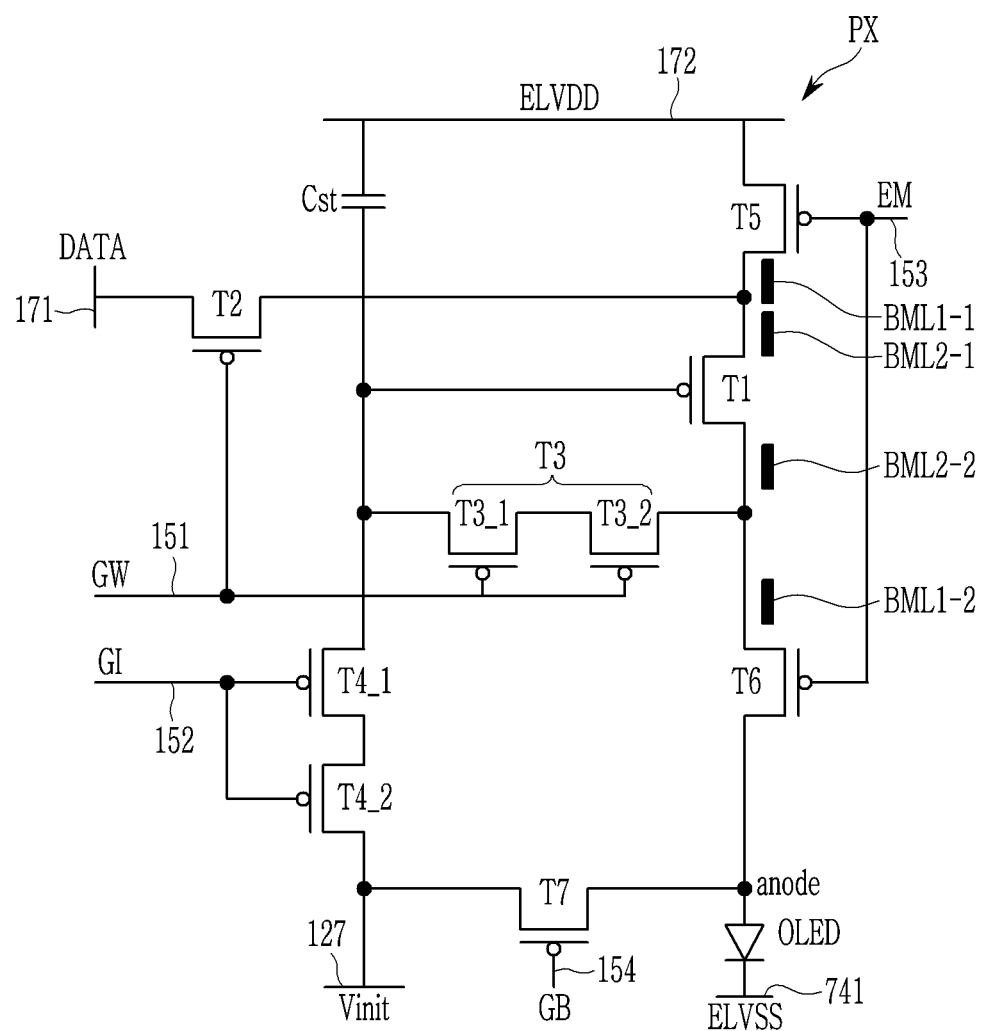
FIG. 11 illustrates a circuit diagram of one pixel according to another embodiment.
Figure 12:
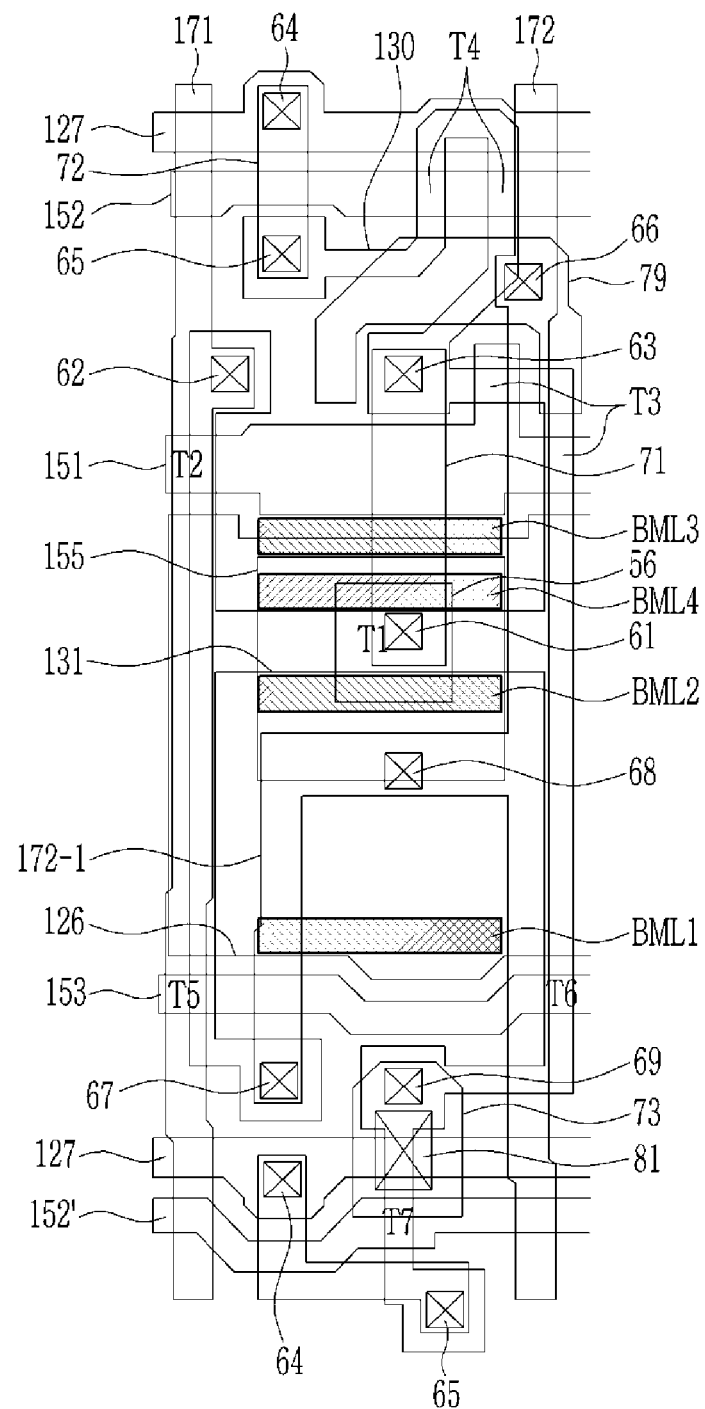
FIG. 12 and FIG. 13 illustrate cross-sectional views of a unit pixel according to another embodiment.
Figure 13:
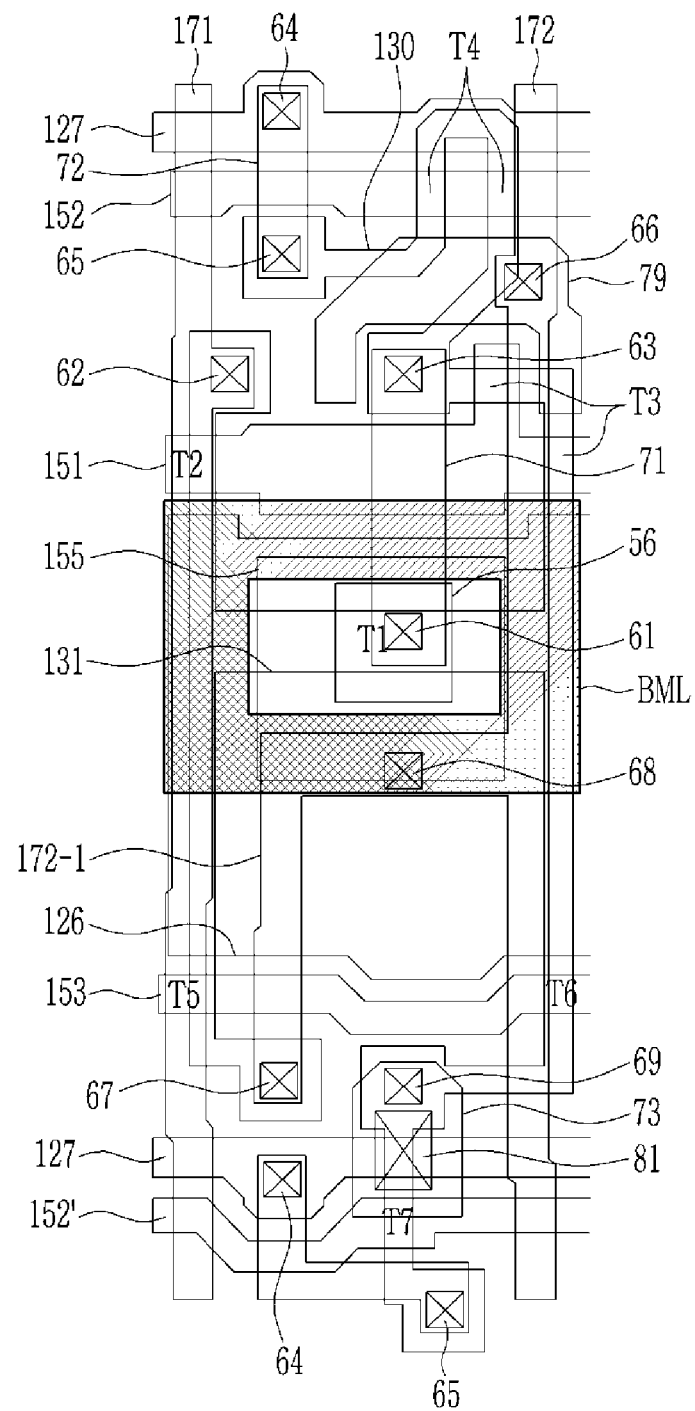

FIG. 11 illustrates a circuit diagram of one pixel according to another embodiment, and FIG. 12 and FIG. 13 illustrate cross-sectional views of a unit pixel according to another embodiment.

First, in FIG. 11, an embodiment in which a plurality of bottom metal layers BML1-1, BML1-2, BML2-1, and BML2-2 are formed in one pixel is illustrated as a circuit diagram.

According to FIG. 11, the plurality of bottom metal layers BML1-1, BML1-2, BML2-1, and BML2-2 between the first driving transistor T1 and the fifth transistor T5 and between the first driving transistor T1 and the sixth transistor T6 are formed and floated.

It is illustrated that the first bottom metal layers BML1-1 and BML1-2 are disposed to be closer to the fifth transistor T5 and the sixth transistor T6, and the second bottom metal layers BML2-1 and BML2-2 are disposed to be closer to the driving transistor T1.

One of the embodiments using the plurality of bottom metal layers is illustrated in FIG. 12.

A pixel as shown in FIG. 12 includes four bottom metal layers BML1, BML2, BML3, and BML4.

Among them, the first bottom metal layer BML1 has a structure in which the first bottom metal layers BML1-1 and BML1-2 of FIG. 11 are integrally formed, and the second bottom metal layer BML2 has a structure in which the second bottom metal layers BML2-1 and BML2-2 of FIG. 11 are integrally formed.

Meanwhile, in FIG. 12, the third bottom metal layer BML3 and the fourth bottom metal layer BML4 are additionally included. Both the third bottom metal layer BML3 and the fourth bottom metal layer BML4 are disposed between the driving transistor T1 and the second transistor T2 and between the driving transistor T1 and the third transistor T3, the fourth bottom metal layer BML4 is disposed to be close to the driving transistor T1, and the third bottom metal layer BML3 is disposed to be away from the driving transistor T1.

Meanwhile, FIG. 13 shows an embodiment that has one bottom metal layer BML and has a structure surrounding the channel of the driving transistor T1.

The bottom metal layer BML of FIG. 13 has a rectangular shape with a rectangular opening. The bottom metal layer BML of FIG. 13 partially overlaps the gate electrode 155 of the driving transistor T1 in a plan view. However, in some embodiments, it may have a structure that does not overlap the gate electrode 155 at a predetermined interval in a plan view.

The embodiment in which the bottom metal layer is being floated has been mainly described, but in some embodiments, a certain voltage such as the driving voltage ELVDD may be applied, or a voltage may be applied by being connected to one electrode (for example, first or second electrode of the driving transistor T1) of the pixel PX.

Referring to FIG. 1, in display device 10, the first display area DA1 does not exist at the upper portion of the second display area DA2. However, the embodiment is not limited thereto, and this will be described with reference to FIG. 14.

Figure 14:
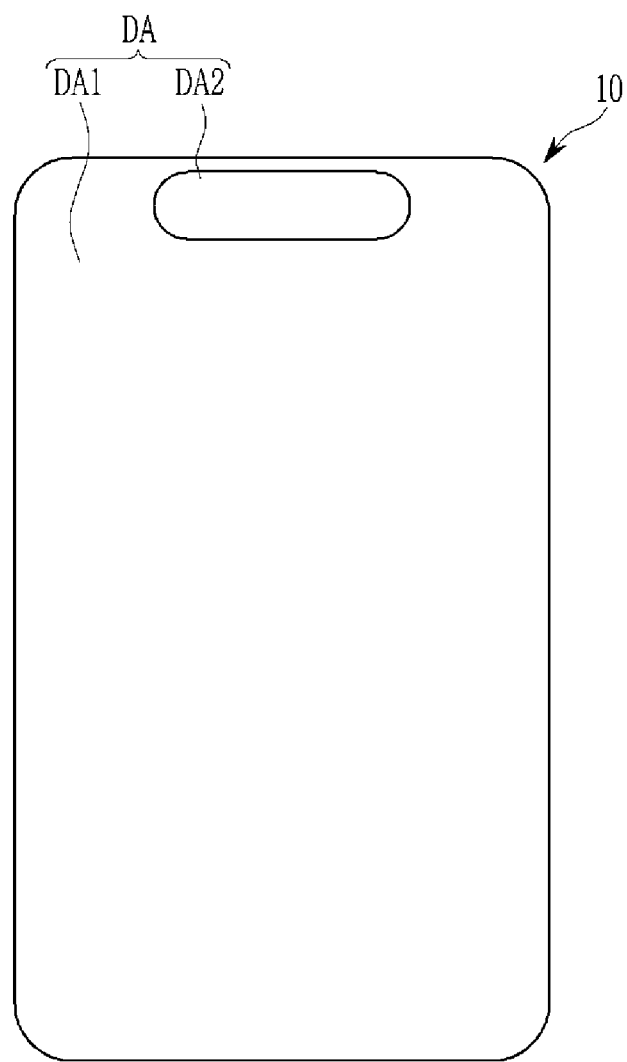
FIG. 14 illustrates a schematic top plan view of a display device according to another embodiment.

FIG. 14 illustrates a schematic top plan view of a display device according to another embodiment.

As shown in FIG. 14, since the first display area DA1 is formed on the second display area DA2 according to the embodiment, the second display area DA2 may be surrounded by the first display area DA1.

In some embodiments, the second display area DA2 may be disposed a little further down and be disposed up to the central portion of the first display area DA1. In addition, in some embodiments, the second display area DA2 may be in plural, and the shape thereof may be variously changed.

In the above, the embodiment in which the pixel having the bottom metal layer is disposed in the second display area DA2 of the display panel 100 corresponding to the position in which an optical element such as a camera is disposed has been mainly described.

However, in a structure in which light may be applied from the rear surface, light may also be applied to a pixel formed corresponding to a portion where a fingerprint recognition sensor is disposed.

Accordingly, hereinafter, another position in which a pixel having the bottom metal layer BML may be disposed will be described with reference to FIG. 15 and FIG. 16.

Figure 15:
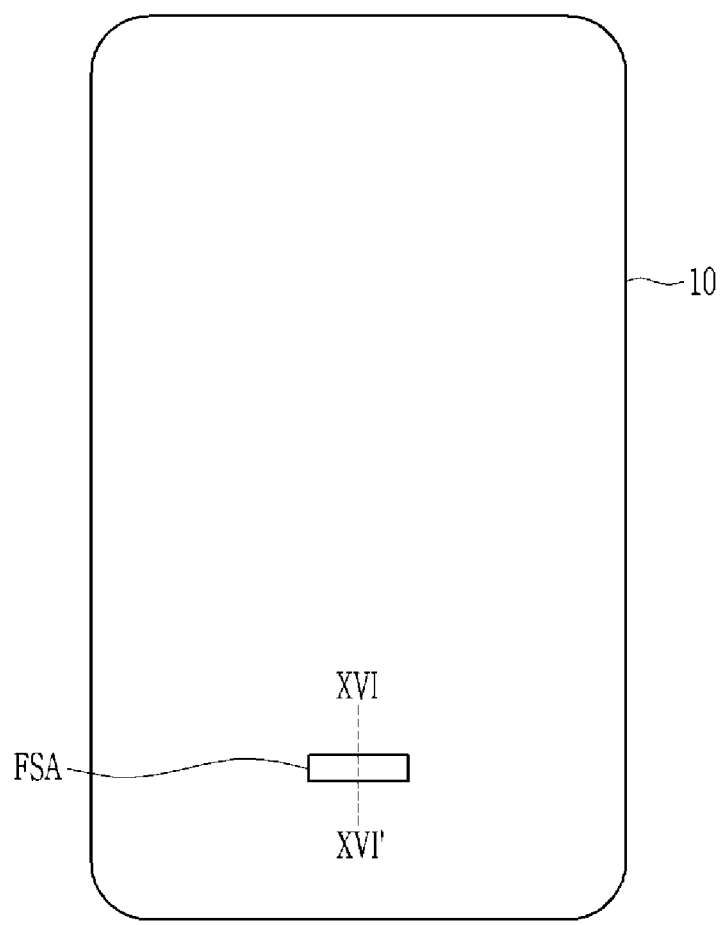
FIG. 15 illustrates a schematic top plan view of a display device according to another embodiment.
Figure 16:
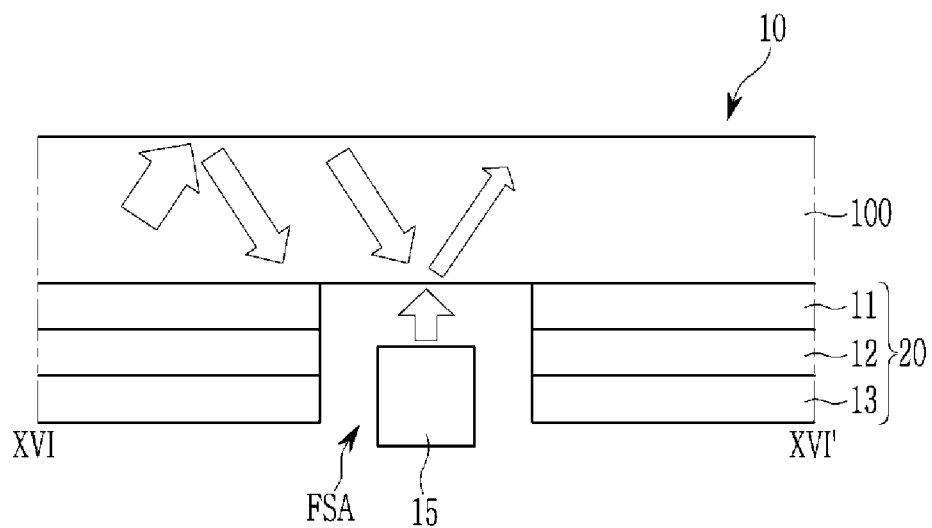
FIG. 16 illustrates a cross-sectional view of the display device taken along line XVI-XVI' of FIG. 15.

FIG. 15 illustrates a schematic top plan view of a display device according to another embodiment, and FIG. 16 illustrates a cross-sectional view of the display device taken along line XVI-XVI of FIG. 15.

A display device 10 according to an embodiment includes a display panel 100, a rear passivation layer 20 including an opening FSA, and a sensor 15.

The rear passivation layer 20 includes a black tape 11, a cushion layer 12, and a metal layer 13. The black tape 11 layer serves to block light from being upwardly provided from a rear surface, and the cushion layer 12 prevents the impact from the rear surface from being transmitted to the display panel 100. In addition, the metal layer 13 allows the display panel 100 to maintain a bent state when it is bent due to its flexible characteristic, and may be made of a metal such as copper (Cu) that may be easily bent.

The sensor 15 is disposed in the opening FSA of the rear passivation layer 20.

The sensor 15 used in the present embodiment is a sensor that senses a user's finger on a front surface of the display panel 100, and in the following embodiment, a fingerprint sensor will be described as an example.

In the present embodiment, the reason the sensor 15 is disposed in the opening FSA of the rear passivation layer 20 is to sense the user's finger on the front surface of the display panel 100. The sensor 15 senses the user's finger through the opening FSA of the rear passivation layer 20, and a double-sided adhesive tape and/or resin layer is further formed to attach the sensor 15 so that the tape is disposed around the opening FSA of the rear passivation layer 20.

As described above, the pixel including the bottom metal layer BML is formed on the display panel 100 corresponding to the opening FSA, so that the influence due to the peripheral electric field caused around the channel of the driving transistor T1 due to the charge on the polyimide (PI) substrate by light applied from the outside may be reduced or eliminated. As a result, the characteristic of the driving transistor T1 is not changed.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display panel having a flexible characteristic; and
a rear passivation layer disposed on a rear surface of the display panel and including an opening,
wherein a pixel formed in an area of the display panel corresponding to the opening includes:
a flexible substrate including a polyimide layer, and a barrier layer disposed on the polyimide layer;
a driving transistor and a fifth transistor disposed on the substrate and including a polycrystalline semiconductor layer;
a light emitting diode receiving an output current of the driving transistor; and
a bottom metal layer disposed between the polyimide layer and the polycrystalline semiconductor layer in a cross-sectional view and disposed around a channel of the driving transistor in a plan view.

2. The display device of claim 1, wherein
a camera or an optical element is disposed in the opening of the rear passivation layer.

3. The display device of claim 1, wherein
the display panel has a first display area that does not correspond to the opening and a second display area that corresponds to the opening,
the second display area includes a transmissive area and a pixel area, and
the pixel is disposed in the pixel area.

4. The display device of claim 3, wherein
the bottom metal layer is disposed in the pixel area at a side of the transmissive area.

5. The display device of claim 1, wherein
the bottom metal layer is disposed between the driving transistor and the fifth transistor.

6. The display device of claim 1, wherein
the bottom metal layer includes a linear portion.

7. The display device of claim 6, wherein
the bottom metal layer further includes a vertical portion positioned at at least one of respective ends of the linear portion.

8. The display device of claim 6, wherein
the bottom metal layer further includes a protrusion extending from the linear portion, and
the protrusion protrudes according to a shape of the polycrystalline semiconductor layer including the channel of the driving transistor.

9. The display device of claim 1, wherein
the bottom metal layer includes a middle opening.

10. The display device of claim 1, wherein
the driving transistor further includes a gate electrode, and
the gate electrode of the driving transistor partially overlaps the bottom metal layer in a plan view.

11. The display device of claim 1, further comprising
a buffer layer disposed between the substrate and the polycrystalline semiconductor layer,
wherein the bottom metal layer is disposed on the substrate and is covered with the buffer layer.

12. The display device of claim 1, wherein
the bottom metal layer is disposed on the polyimide layer and is covered by the barrier layer.

13. The display device of claim 1, wherein
the substrate includes two polyimide layers and two barrier layers.

14. The display device of claim 1, wherein
a fingerprint sensor is disposed in the opening of the rear passivation layer.

15. A display device comprising:
a flexible substrate including a polyimide layer, and a barrier layer disposed on the polyimide layer; and
a unit pixel disposed on the substrate and including a first pixel, a second pixel, and a third pixel,
wherein each of the first pixel, the second pixel, and the third pixel includes:
a driving transistor disposed on the substrate and including a polycrystalline semiconductor layer;
a light emitting diode receiving an output current of the driving transistor; and
a bottom metal layer disposed between the polyimide layer and the polycrystalline semiconductor layer in a cross-sectional view and disposed around a channel of the driving transistor in a plan view, and
a shape of a first bottom metal layer included in the first pixel is different from a shape of a second bottom metal layer included in the second pixel and a shape of a third bottom metal layer included in the third pixel.

16. The display device of claim 15, wherein
at least one of the first bottom metal layer, the second bottom metal layer, and the third bottom metal layer includes a linear portion, and a vertical portion disposed at at least one of respective ends of the linear portion.

17. The display device of claim 15, wherein
at least one of the first bottom metal layer, the second bottom metal layer, and the third bottom metal layer includes a protrusion, and
the protrusion protrudes according to a shape of the polycrystalline semiconductor layer including the channel of the driving transistor.

18. The display device of claim 15, further comprising
a buffer layer disposed between the substrate and the polycrystalline semiconductor layer,
wherein the bottom metal layer is disposed on the substrate and is covered with the buffer layer.

19. The display device of claim 15, wherein
the bottom metal layer is disposed on the polyimide layer
and is covered by the barrier layer.
20. The display device of claim 15, further comprising
a rear passivation layer disposed on a rear surface of the
substrate and including an opening,
wherein the unit pixel is formed in an area of the substrate
corresponding to the opening.

\* \* \* \* \*